United States Patent
Zhu et al.

(10) Patent No.: US 12,402,274 B1
(45) Date of Patent: Aug. 26, 2025

(54) IMMERSION LIQUID-COOLING SYSTEM AND CONTROL METHOD THEREFOR, AND SERVER

(71) Applicant: Suzhou MetaBrain Intelligent Technology Co., Ltd., Suzhou (CN)

(72) Inventors: Tao Zhu, Suzhou (CN); Guangzhi Liu, Suzhou (CN)

(73) Assignee: Suzhou MetaBrain Intelligent Technology Co., Ltd., Suzhou (CN)

( * ) Notice: Subject to any disclaimer, the term of this patent is extended or adjusted under 35 U.S.C. 154(b) by 0 days.

(21) Appl. No.: 19/115,585

(22) PCT Filed: Feb. 27, 2024

(86) PCT No.: PCT/CN2024/078756
§ 371 (c)(1),
(2) Date: Mar. 26, 2025

(87) PCT Pub. No.: WO2024/239740
PCT Pub. Date: Nov. 28, 2024

(30) Foreign Application Priority Data

May 23, 2023 (CN) .......................... 202310582223.2

(51) Int. Cl.
H05K 7/20 (2006.01)
(52) U.S. Cl.
CPC ..... H05K 7/20236 (2013.01); H05K 7/20272 (2013.01); H05K 7/20772 (2013.01)
(58) Field of Classification Search
CPC ........... H05K 7/20236; H05K 7/20272; H05K 7/20772
See application file for complete search history.

(56) References Cited

U.S. PATENT DOCUMENTS

| 11,191,186 B2 * | 11/2021 | Smith .................... H05K 7/203 |
| 11,647,607 B2 * | 5/2023 | Dogruoz .............. H05K 7/2089 310/58 |

(Continued)

FOREIGN PATENT DOCUMENTS

| CN | 102449407 A | 5/2012 |
| CN | 109960382 A | 7/2019 |

(Continued)

OTHER PUBLICATIONS

International Search Report of corresponding PCT application (PCT/CN2024/078756) Jun. 20, 2024 including English translation (6 pages).

(Continued)

*Primary Examiner* — Zachary Pape
(74) *Attorney, Agent, or Firm* — Crowell & Moring LLP (57) ABSTRACT

The present application relates to an immersion liquid-cooling system and a control method therefor, and a server. The immersion liquid-cooling system includes a liquid-cooling chassis filled with a liquid-state cooling working medium and a mainboard fixed in the liquid-cooling chassis in a vertical direction; the mainboard is provided with at least one high-power component and at least one low-power component; the liquid-cooling chassis includes a chassis body, main fluid deflectors, secondary fluid deflectors, and flow adjustment plates; the main fluid deflectors extend in the vertical direction to form a main flow channel, and the main flow channel contains all high-power components; the secondary fluid deflectors are arranged opposite to the main (Continued)

fluid deflectors to form secondary flow channels, and the secondary flow channels contain the low-power components; and the secondary flow channels are connected to the main flow channel by means of the flow adjustment plates.

20 Claims, 4 Drawing Sheets

(56) References Cited

U.S. PATENT DOCUMENTS

| | | | |
|---|---|---|---|
| 2022/0225539 | A1 | 7/2022 | Gao |
| 2023/0046075 | A1* | 2/2023 | Chen ................. H05K 7/20272 |
| 2023/0217626 | A1* | 7/2023 | Keehn .................... H01L 23/44 |
| | | | 361/679.53 |
| 2024/0365502 | A1* | 10/2024 | Hsu .................... H05K 7/20772 |
| 2024/0373589 | A1* | 11/2024 | Nagimov ........... H05K 7/20727 |

FOREIGN PATENT DOCUMENTS

| | | |
|---|---|---|
| CN | 110099554 A | 8/2019 |
| CN | 110099555 A | 8/2019 |
| CN | 111352489 A | 6/2020 |
| CN | 112455211 A | 3/2021 |
| CN | 112578878 A | 3/2021 |
| CN | 113766801 A | 12/2021 |
| CN | 114916188 A | 8/2022 |
| CN | 217641534 U | 10/2022 |
| CN | 116048224 A | 5/2023 |
| CN | 116301265 A | 6/2023 |

OTHER PUBLICATIONS

Written Opinion of International Searching Authority of corresponding PCT application (PCT/CN2024/078756) Jun. 20, 2024 including English translation (7 pages).
Search report of corresponding CN priority application (CN202310582223.2) Jun. 28, 2023 (3 pages).
Notification to Grant Patent Right for Invention of corresponding CN priority application (CN202310582223.2) Jul. 1, 2023 including English translation, and issued patent and English translation of allowed claims of corresponding CN priority application CN202310582223.2 (26 pages).
Shuo Zhang, Research on Parallel Computing Architecture of Multiple CNN Models on FPGA, «China Doctor/Master Dissertations Full-text Database(Doctor)-Information Technology Album» vol. (2021)06, Jun. 15, 2021, I135-29 with English abstract (6 pages).

\* cited by examiner

IMMERSION LIQUID-COOLING SYSTEM AND CONTROL METHOD THEREFOR, AND SERVER

CROSS-REFERENCE TO RELATED APPLICATION

This application is the national phase application of International Application No. PCT/CN2024/078756, filed Feb. 27, 2024, which claims priority to Chinese Patent Application No. 202310582223.2, filed on May 23, 2023 in China National Intellectual Property Administration and entitled "Immersion Liquid-cooling System and Control Method Therefor, and Server". The contents of International Application No. PCT/CN2024/078756 and Chinese Patent Application No. 202310582223.2 are each herein incorporated by reference in their entireties.

FIELD

The present application relates to the technical field of cold-plate servers, in particular to an immersion liquid-cooling system and a control method therefor, and a server.

BACKGROUND

With the advent of the era of big data, the demand for computing power has also shown a rapid growth trend, which has led to the continuous improvement on the power density of chips, so the use of traditional air-cooled heat dissipation can no longer meet the heat dissipation problem of chips in high heat flux density scenarios. At the same time, as the State has higher and higher requirements for low energy consumption of data centers, traditional air-cooled data centers cannot meet the requirements for low energy consumption. Therefore, liquid cooling has become a major trend of heat dissipation of chips in data centers, and the development about liquid cooling technologies has attracted more and more attention from practitioners. At present, the mainstream liquid cooling methods include cold-plate liquid cooling and immersed liquid cooling, but there are many heat dissipation components in a server. If the server is subjected to fully liquid-cooled cold-plate heat dissipation, the system is very complex. Therefore, most of the current servers use a hybrid heat dissipation method of air cooling and liquid cold plates, which still require the participation of fans and air conditioners in a computer room, resulting in poor economy. In addition, cold-plate liquid cooling is also problematic in leakage of a liquid-cooling working medium, and there is a risk of server downtime due to liquid leakage, so cold-plate liquid cooling has been greatly challenged.

In the current immersion liquid-cooling solution, a server mainboard is directly immersed in the cooling working medium to achieve effective heat exchange. However, due to large differences in power consumption of different components, in the traditional circuit, a circulation system of cooling liquid achieves indiscriminate cooling of various components, which is prone to the overtemperature of some high-power devices. In order to meet the requirements for heat dissipation of some high-power devices, the circulation rate of the cooling working medium can only be continuously increased, and the heat exchange efficiency of various components can be improved as a whole. Although this method can solve the heat dissipation of various devices, the increase of the circulation rate of the cooling working medium will inevitably be accompanied by the increase of pump work, and the economy will gradually decrease. At the same time, some components with low power consumption can achieve better heat dissipation without a large circulation rate of the cooling working medium, so it is necessary to continuously optimize an immersion liquid-cooling system to achieve an economical liquid cooling cycle.

SUMMARY

Based on this, it is necessary to provide an immersion liquid-cooling system, a control method therefor and a server for the above-mentioned technical problems, which can achieve partitioned temperature control, and also can solve the technical problems that the current server that is directly immersed in the cooling working medium can neither achieve differential heat exchange for different power components immersed in cooling liquid, nor achieve partitioned control of areas with different power density and adapt to the cooling requirements for components with different heat dissipation requirements, resulting in poor economy.

In an aspect, an immersion liquid-cooling system is provided. The immersion liquid-cooling system includes a liquid-cooling chassis and a mainboard, wherein the mainboard is fixed in the liquid-cooling chassis in a vertical direction, and a liquid-state cooling working medium is filled in the liquid-cooling chassis, whereby the mainboard is immersed in the liquid-state cooling working medium;

the mainboard is provided with at least one high-power component and at least one low-power component; the heat dissipation capacity of the high-power components per unit time is greater than the heat dissipation capacity of the low-power components per unit time;

the liquid-cooling chassis includes a chassis body, main fluid deflectors, secondary fluid deflectors, and flow adjustment plates; the main fluid deflectors extend in the vertical direction to form a main flow channel, and the main flow channel contains all high-power components; the secondary fluid deflectors are arranged opposite to the main fluid deflectors to form secondary flow channels, and the secondary flow channels contain the low-power components; and the secondary flow channels are connected to the main flow channel by means of the flow adjustment plates.

In some embodiments, the chassis is provided with a working medium inlet at a top portion thereof and a working medium outlet at a bottom portion thereof; and the main flow channel is provided with a main flow channel inlet at a top end thereof and a main flow channel outlet at a bottom end thereof, wherein the main flow channel inlet is arranged adjacent to the working medium inlet, and the main flow channel outlet is communicated with the working medium outlet.

In some embodiments, the immersion liquid-cooling system further includes a working medium inlet pipe and a working medium outlet pipe; and the working medium inlet pipe is connected to the working medium inlet, and the working medium outlet pipe is connected to the working medium outlet.

In some embodiments, the working medium inlet pipe extends from the top of the working medium inlet pipe extends from the top portion of the chassis body to the bottom portion of the chassis body in the chassis body, and then extends from the bottom portion of the chassis body to above the main flow channel inlet; and the liquid-state cooling working medium in the working medium inlet pipe exchanges heat with the liquid-state cooling working medium in the chassis body.

In some embodiments, the working medium inlet pipe is in the form of a spiral tube in the chassis body.

In some embodiments, in the chassis body, the liquid-state cooling working medium between the working medium inlet pipe and the main flow channel or the secondary flow channels dissipates heat in a self-circulation manner.

In some embodiments, the immersion liquid-cooling system further includes a circulating pump and a heat exchanger, wherein the circulating pump is installed on the working medium outlet pipe, and the heat exchanger is connected between the working medium outlet pipe and the working medium inlet pipe.

In some embodiments, a depth of the liquid-state cooling working medium in the chassis body is greater than a length of the mainboard along the vertical direction, and the mainboard is completely immersed in the liquid-state cooling working medium; and the main flow channel and the secondary flow channels are completely immersed in the liquid-state cooling working medium.

In some embodiments, the secondary flow channels are adjacent to the main flow channel, and the secondary flow channels are located on both sides of the main flow channel.

In some embodiments, the secondary fluid deflectors are installed on the main fluid deflectors to form the secondary flow channels.

In some embodiments, one end of each of the secondary flow channels connected to the main flow channel is a secondary flow channel outlet, and the flow adjustment plate is provided on the secondary flow channel outlet; the other end of the secondary flow channel away from the main flow channel forms a secondary flow channel inlet; and the liquid-state cooling working medium can flow through the flow adjustment plates via the secondary flow channels into the main flow channel.

In some embodiments, each of the flow adjustment plates includes shutter blades and a motor, wherein the motor is configured to control the rotation of the shutter blades.

In some embodiments, each flow adjustment plate includes an adjustable valve.

In some embodiments, each of the main fluid deflectors is provided with spoilers at a position corresponding to the high-power component.

In some embodiments, the spoilerspoiler is in the form of a baffle plate or wave-shaped.

In some embodiments, in the main flow channel, in the main flow channel, a spoiler matrix structure is provided at a side flowing into the high-power component, and the spoiler matrix structure comprises a plurality of spoiler columns arranged in an array.

In some embodiments, the spoiler matrix structures are provided on the main fluid deflectors.

In some embodiments, the cross-sectional shape of each spoiler column is circular, triangular or waterdrop-shaped.

In some embodiments, the high-power components include a chip.

In another aspect, a server is provided. The server includes the immersion liquid-cooling system as described above.

In yet another aspect, a control method for the immersion liquid-cooling system as described above is provided. The control method includes the following steps:

fixing a mainboard in a liquid-cooling chassis in a vertical direction, and filling a liquid-state cooling working medium in the liquid-cooling chassis, whereby the mainboard is immersed in the liquid-state cooling working medium;

controlling the liquid-state cooling working medium to circularly cool all high-power components along the main flow channel; and controlling the liquid-state cooling working medium to circularly cool all low-power components along the secondary flow channels, wherein the liquid-state cooling working medium in the secondary flow channels flows into the main flow channel to recool the high-power components.

According to the immersion liquid-cooling system, the control method therefor and the server, differential heat exchange and cooling is achieved by performing partitioned control for components with different powers according to different requirements for heat dissipation of various components in the immersion liquid-cooling system, and the flow of fluid is coordinated and distributed according to the requirements for heat dissipation of different areas, thereby achieving directional conveying of cooling liquid and improving the comprehensive efficiency. Differential heat exchange and cooling is achieved by performing partitioned control for components with different powers according to different requirements for heat dissipation of various components in the immersion liquid-cooling system, and the flow of fluid is coordinated and distributed according to the requirements for heat dissipation of different areas, thereby achieving directional conveying of cooling liquid and improving the comprehensive efficiency.

BRIEF DESCRIPTION OF THE DRAWINGS

To describe the technical solutions of the embodiments of the present application more clearly, the following briefly introduces the accompanying drawings required for describing the embodiments. Apparently, the accompanying drawings in the following description show only some embodiments of the present application, and a person of ordinary skill in the art may still derive other drawings from these accompanying drawings without creative efforts.

DETAILED DESCRIPTION

To make the objectives, technical solutions, and advantages of the present application clearer, the following further describes the present application in detail in combination with the accompanying drawings and the embodiments. It is understandable that the specific embodiments described herein are only used for explaining the present application, and are not used for limiting the present application.

Embodiment 1

As described in Background, the server in the prior art that is generally immersed in the cooling working medium directly can achieve indiscriminate heat exchange for chips with different powers immersed in cooling liquid, but cannot achieve partitioned control of areas with different power density, resulting in poor economy.

In order to solve the problem of different requirements for heat dissipation of various components in an immersion liquid-cooling system and achieve the function of coordinating and distributing the flow of fluid according to the requirements for heat dissipation of different areas, the present application inventively provides a single-phase immersion liquid-cooling system that can achieve partitioned temperature control, whereby the immersion liquid-cooling system can achieve efficient and economical circulation of the cooling working medium.

Figure 1:
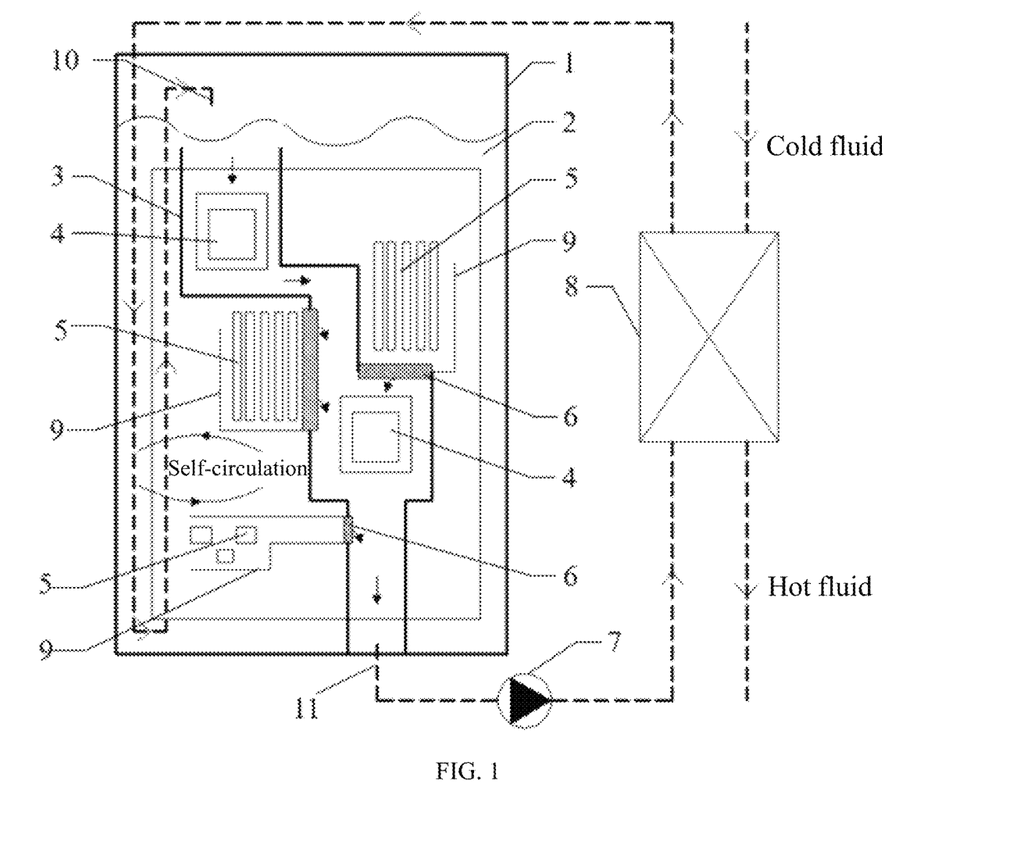
FIG. 1 is a front view of an immersion liquid-cooling system in one embodiment.
Figure 2:
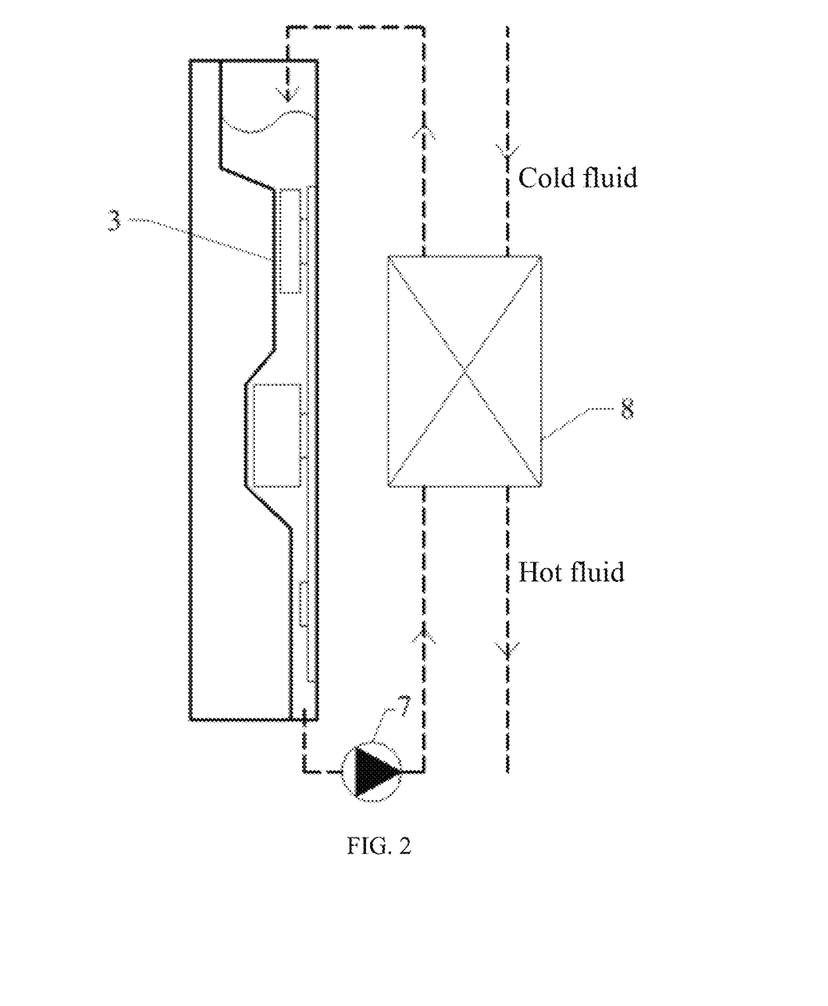
FIG. 2 is a right view of an immersion liquid-cooling system in one embodiment.
Figure 3:
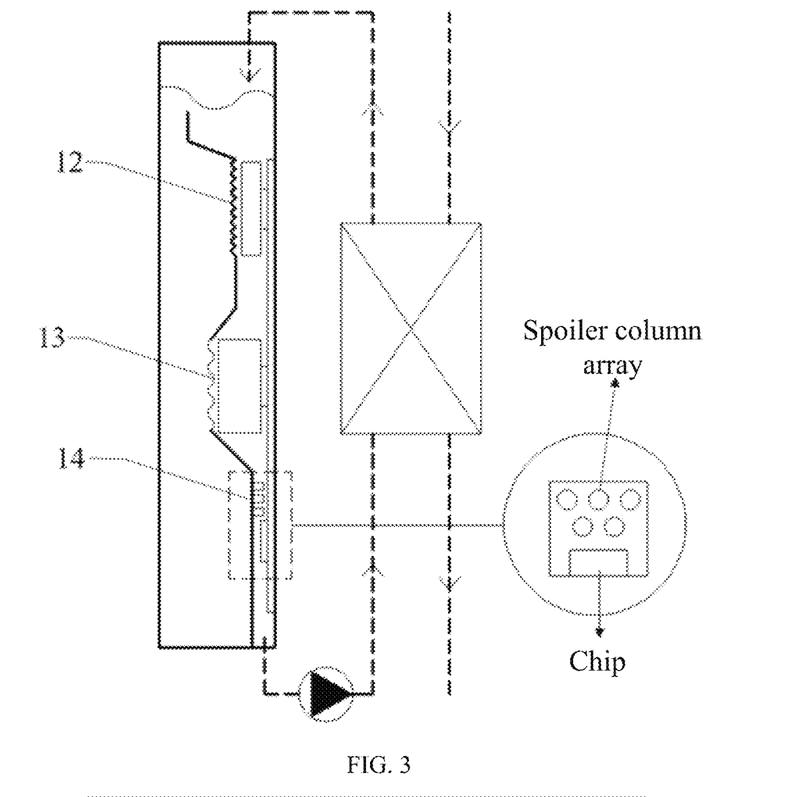
FIG. 3 is a right view of an immersion liquid-cooling system in another embodiment.

As shown in FIG. 1, FIG. 2 and FIG. 3, the immersion liquid-cooling system includes a liquid-cooling chassis and a mainboard, wherein the mainboard is fixed in the liquid-cooling chassis in a vertical direction, and immersion cooling liquid the liquid-cooling chassis is filled with a liquid-state cooling working medium 2 (i.e., immersion cooling liquid 2), whereby the mainboard is immersed in the liquid-state cooling working medium.

The liquid-cooling chassis includes a chassis body 1, main fluid deflectors 3, high-power component areas 4, low-power component areas 5, flow adjustment plates 6 (preferably, a shutter with an adjustable opening degree), and secondary fluid deflectors 9. The immersion liquid-cooling system further includes a circulating pump 7, a heat exchanger 8, a working medium inlet pipe 10, and a working medium outlet pipe 11.

As shown in FIG. 1, the high-power component areas 4 are isolated from other areas by means of the main fluid deflectors 3 to form a relatively independent flow channel. This flow channel is the main flow channel in which the immersion cooling liquid 2 flows. This flow channel is a main channel in which the immersion cooling liquid 2 flows at a high flow under the driving of the circulating pump 7, which is conducive to favorable heat dissipation of high-power components. As shown in FIG. 2, as the immersion cooling liquid 2 flows through a key device area, the main fluid deflectors 3 are bent towards the device area, whereby a flow channel in the key device area become narrowed and the flow in a heat exchange area of a key device is further increased, which is conducive to heat dissipation.

Further, a baffle-plate-shaped spoiler structure 12 and a wave-shaped spoiler structure 13 can be designed at the top of the key device area of each main flow guide cover, or a plurality of spoiler columns arranged in an array are adopted to form a spoiler matrix structure 14 which is provided upstream of a chip, and adjacent two rows of spoiler columns are staggered upstream of the chip to enhance the disturbance in the key device area and enhance the heat transfer of the chip.

For the low-power component areas 5, in the present application, effective flow guide is performed by means of the secondary fluid deflectors 9; the secondary fluid deflectors 9 are installed on the main fluid deflectors 3 to form secondary flow channels; the secondary flow channels are connected to the main flow channel through the flow adjustment plates 6; and each flow adjustment plate 6 is preferably a shutter with an adjustable opening degree, and the shutter drives blades to rotate through a motor to adjust the opening degree of the shutter, thereby effectively adjusting the flow of the fluid flowing into the main flow channel from the secondary flow channels, then effectively controlling the flow of the working medium in the secondary flow channels, and accordingly adjusting the temperature of the low-power component areas 5 in the secondary flow channels.

The working medium outlet pipe 11 of the whole system is installed in the main flow channel area. Under the action of the circulating pump 7, the fluid in the main flow channel is pumped out of the chassis, and the high-temperature fluid heated by the components is conveyed into the heat exchanger 8 by means of the circulating pump 7, and is cooled by an external cold source in the heat exchanger 8 to obtain a low-temperature working medium, and then the low-temperature working medium is conveyed back to the chassis through the working medium inlet pipe 10.

The low-temperature working medium from the heat exchanger 8 enters the chassis, penetrates deep into the bottom portion of the chassis through a pipeline, and then turns back to the top of the chassis and into the system. The pipeline in the chassis may be set in the shape of a spiral tube, which increases a heat exchange area between the pipeline and immersed liquid, and facilitates to cooling the immersed liquid that does not participate in the circulation in the chassis. After this method is adopted, the low-temperature working medium is provided on one side of the chassis, and a high-temperature working medium is provided at components other than the main flow channel and the secondary flow channels. There is a density difference between the high-temperature working medium and the low-temperature working medium, so the self-circulation of the low-temperature working medium and the high-temperature working medium is formed under the driving of the density difference, which is conducive to realizing the self-circulation heat dissipation of the low-power components.

The system has good operating economy, and can adjust the flow of the system and the opening degree of the shutter according to a difference between a junction temperature Tj of each chip and a maximum temperature Tspec required by heat dissipation of each party (Spec) during the system debugging process. As the power of the chip in the main flow channel increases, resulting in Tj being higher than Tspec, under the premise that Tj of the chip in the other secondary flow channel is lower than Tspec, the opening degree of the shutter is reduced, the heat dissipation efficiency of the chip in the main flow channel is improved, and Tj is reduced. If the heat dissipation of the chip in the secondary flow channel reaches the limit such that the heat dissipation of the chip in the main flow channel cannot be strengthened by the adjustment of the shutter, and if Tj in the main flow channel is still higher than Tspec at this time, the power of the circulating pump 7 and the circulation rate of the immersed liquid can both be increased, thereby reducing the junction temperature of the chip.

During the normal operation process, Tj of all devices are lower than Tspec, an area with a large difference between Tj and Tspec can be identified at this time, and the opening degree of the shutter in this area can be adjusted to reduce the difference between the two values, so as to minimize the circulation rate of the cooling working medium, reduce the power consumption of the pump, and improve the economy of the system.

The single-phase immersion liquid-cooling system that can achieve partitioned temperature control provided by the present application can solve the problem of different requirements for heat dissipation of various components in the immersion liquid-cooling system and achieve the function of coordinating and distributing the flow of fluid according to the requirements for heat dissipation of different areas, whereby the immersion liquid-cooling system can realize efficient and economical circulation of the cooling working medium.

The single-phase immersion liquid-cooling system that can achieve partitioned temperature control provided by the present embodiment can achieve the adjustment of flow in different areas by providing the flow guide covers to distinguish the main flow channel from the secondary flow channels in combination the shutter, and also achieve the purpose of partitioned temperature control, thereby minimizing the circulation rate of the cooling working medium and reducing the power consumption of the pump.

As shown in FIG. 3, a baffle-plate-shaped spoilerspoiler 12 and a wave-shaped spoilerspoiler 13 can be designed at the top of the key device area of the main flow guide cover, or a plurality of spoiler columns arranged in an array are adopted to form a spoiler matrix structure 14 which is provided at the front of the chip, and adjacent two rows of spoiler columns are staggered at the front of the chip to enhance the disturbance in the key device area and enhance the heat transfer of the chip.

It is understandable that the main flow channel and the secondary flow channels in the present embodiment can be specifically adjusted and designed according to actual situations, and a path of the working medium inlet pipe into the system is also only schematic, and can be adjusted accordingly according to the structure; and the shutter may also be replaced with other forms of adjustable valves, etc. The arrangement of the wave-shaped plate, the baffle plate or the spoiler columns mentioned in the present embodiment may also be replaced with other spoiler modes, and the cross-sectional shape of the spoiler column may be circular, triangular or waterdrop-shaped, etc.

Embodiment 2

Based on the same inventive concept as Embodiment 1, all the technical features of Embodiment 1 are included in Embodiment 2. As shown in FIG. 1, an immersion liquid-cooling system is provided in Embodiment 2. The immersion liquid-cooling system includes a liquid-cooling chassis and a mainboard.

The mainboard is fixed in the liquid-cooling chassis in a vertical direction, and a liquid-state cooling working medium 2 (i.e., immersion cooling liquid) is filled in the liquid-cooling chassis, whereby the mainboard is immersed in the liquid-state cooling working medium.

The mainboard is provided with at least one high-power component and at least one low-power component; and the heat dissipation capacity of the high-power components per unit time is greater than the heat dissipation capacity of the low-power components per unit time.

The liquid-cooling chassis includes a chassis body 1, main fluid deflectors 3, secondary fluid deflectors 9, and flow adjustment plates 6; the main fluid deflectors 3 extend in the vertical direction to form a main flow channel, and the main flow channel contains all high-power components; the secondary fluid deflectors 9 are arranged opposite to the main fluid deflectors 3 to form secondary flow channels, and the secondary flow channels contain the low-power components; and the secondary flow channels are connected to the main flow channel by means of the flow adjustment plates 6.

It is understandable that areas inside the chassis body 1 corresponding to the high-power components are high-power component areas 4, and areas inside the chassis body 1 corresponding to the low-power components are low-power component areas 5; the main flow channel contains all high-power component areas 4 and does not contain the low-power component areas 5; the secondary flow channels contain the low-power component areas 5; and the secondary flow channels are connected to the main flow channel through the flow adjustment plates 6, whereby the low-power components in the low-power component areas 5 are cooled first, then the high-power components in the high-power component areas 4 are cooled, and the cooling sequence is reasonably arranged, thereby fully improving the cooling efficiency of the liquid-state cooling working medium 2.

The main flow channel is a main circulation channel of the liquid-state cooling working medium 2, and a flow of the liquid in the main flow channel is greater than a flow of the liquid in the secondary flow channels, which is conducive to heat dissipation.

In the present embodiment, a working medium inlet is formed in the top of the chassis body 1, and a working medium outlet is formed in the bottom portion of the chassis body 1; and a main flow channel inlet is formed in the top end of the main flow channel, a main flow channel outlet is formed in the bottom end of the main flow channel, the main flow channel inlet is adjacent to the working medium inlet, and the main flow channel outlet is communicated with the working medium outlet.

In the present embodiment, the immersion liquid-cooling system further includes a working medium inlet pipe 10 and a working medium outlet pipe 11; and the working medium inlet pipe 10 is connected to the working medium inlet, and the working medium outlet pipe 11 is connected to the working medium outlet.

In the present embodiment, the working medium inlet pipe 10 extends from the top of the chassis body 1 to the bottom portion of the chassis body 1 in the chassis body 1, and then extends from the bottom portion of the chassis body 1 to the upper side of the main flow channel inlet; and the liquid-state cooling working medium 2 in the working medium inlet pipe 10 exchanges heat with the liquid-state cooling working medium 2 in the chassis body 1.

In the present embodiment, the working medium inlet pipe 10 in the chassis body 1 may be set in the shape of a spiral tube, which increases a heat exchange area between the pipeline and the immersed liquid, and facilitates to cooling the immersed liquid that does not participate in the circulation in the chassis.

In the present embodiment, in the chassis body 1, the liquid-state cooling working medium 2 between the working medium inlet pipe 10 and the main flow channel or the secondary flow channels dissipates heat in a self-circulation manner.

In the present embodiment, the immersion liquid-cooling system further includes a circulating pump 7 and a heat exchanger 8, wherein the circulating pump 7 is installed on the working medium outlet pipe 11, and the heat exchanger 8 is connected between the working medium outlet pipe 11 and the working medium inlet pipe 10.

In the present embodiment, the secondary flow channels are adjacent to the main flow channel, and the secondary flow channels are located on both sides of the main flow channel.

In the present embodiment, the secondary fluid deflectors 9 are installed on the main fluid deflectors 3 to form the secondary flow channels.

In the present embodiment, a secondary flow channel outlet is provided at one end of each secondary flow channel that is connected to the main flow channel, and the flow adjustment plate 6 is provided on the secondary flow channel outlet; a secondary flow channel inlet is formed at one end of the secondary flow channel away from the main flow channel; and the liquid-state cooling working medium 2 can flow through the flow adjustment plates 6 through the secondary flow channels into the main flow channel.

In the present embodiment, each flow adjustment plate 6 includes shutter blades and a motor, wherein the motor is configured to control the rotation of the shutter blades.

In the present embodiment, each flow adjustment plate 6 includes an adjustable valve.

In the present embodiment, a spoilerspoiler is provided on a position of each fluid main flow guide cover 3 corresponding to the high-power component.

In the present embodiment, the spoilerspoiler is in the form of a baffle plate or wave-shaped. As shown in FIG. 3, a baffle-plate-shaped spoilerspoiler 12 and a wave-shaped spoilerspoiler 13 can be designed at the top of the key device area of the main flow guide cover, and adjacent two rows of spoiler columns are staggered at the front of the chip to enhance the disturbance in the key device area and enhance the heat transfer of the chip.

In the present embodiment, in the main flow channel, a spoiler matrix structure 14 is provided to flow into one side of the high-power component, and the spoiler matrix structure 14 includes a plurality of spoiler columns arranged in an array.

In the present embodiment, the spoiler matrix structures 14 are provided on the main fluid deflectors 3.

In the present embodiment, the cross-sectional shape of each spoiler column is circular, triangular or waterdrop-shaped.

In the present embodiment, the high-power components include a chip.

The system has good operating economy, and can adjust the flow of the system and the opening degree of the shutter according to a difference between a junction temperature Tj of each chip and a maximum temperature Tspec required by heat dissipation of each party (Spec) during the system debugging process. As the power of the chip in the main flow channel increases, resulting in Tj being higher than Tspec, under the premise that Tj of the chip in the other secondary flow channel is lower than Tspec, the opening degree of the shutter is reduced, the heat dissipation efficiency of the chip in the main flow channel is improved, and Tj is reduced. If the heat dissipation of the chip in the secondary flow channel reaches the limit such that the heat dissipation of the chip in the main flow channel cannot be strengthened by the adjustment of the shutter, and if Tj in the main flow channel is still higher than Tspec at this time, the power of the circulating pump 7 and the circulation rate of the immersed liquid can both be increased, thereby reducing the junction temperature of the chip.

During the normal operation process, Tjs of all devices are lower than Tspec, an area with a large difference between Tj and Tspec can be identified at this time, and the opening degree of the shutter in this area can be adjusted to reduce the difference between the two values, so as to minimize the circulation rate of the cooling working medium, reduce the power consumption of the pump, and improve the economy of the system.

In the immersion liquid-cooling system, differential heat exchange and cooling is achieved by performing partitioned control for components with different powers according to different requirements for heat dissipation of various components in the immersion liquid-cooling system, and the flow of fluid is coordinated and distributed according to the requirements for heat dissipation of different areas, thereby achieving directional conveying of the immersion cooling liquid 2 and improving the comprehensive efficiency.

Embodiment 3

Figure 4:
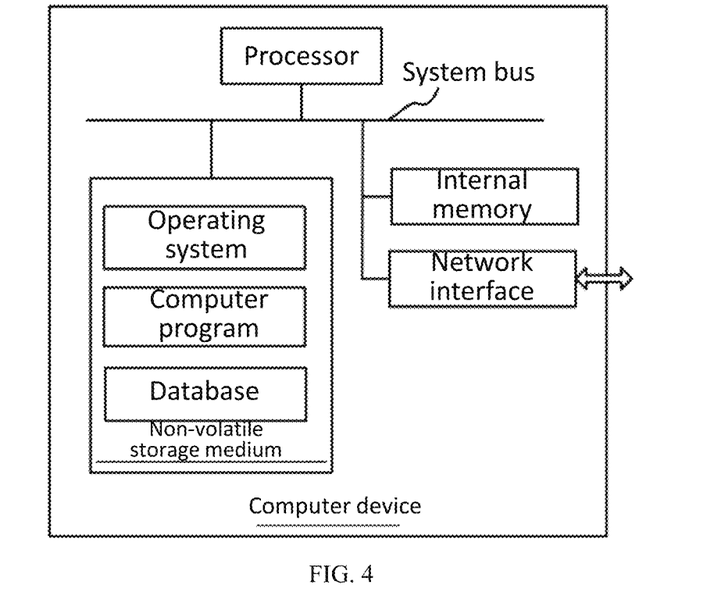
FIG. 4 is a schematic structural diagram of a server in one embodiment.

In Embodiment 3, as shown in FIG. 4, a server is provided. The server includes the immersion liquid-cooling system.

In the present embodiment, a working medium inlet is formed in the top portion of the chassis body 1, and a working medium outlet is formed in the bottom portion of the chassis body 1; and a main flow channel inlet is formed in the top end of the main flow channel, a main flow channel outlet is formed in the bottom end of the main flow channel, the main flow channel inlet is adjacent to the working medium inlet, and the main flow channel outlet is communicated with the working medium outlet.

In the present embodiment, the immersion liquid-cooling system further includes a working medium inlet pipe 10 and a working medium outlet pipe 11; and the working medium inlet pipe 10 is connected to the working medium inlet, and the working medium outlet pipe 11 is connected to the working medium outlet.

In the present embodiment, the working medium inlet pipe 10 extends from the top portion of the chassis body 1 to the bottom portion of the chassis body 1 in the chassis body 1, and then extends from the bottom portion of the chassis body 1 to the upper side of the main flow channel inlet; and the liquid-state cooling working medium 2 in the working medium inlet pipe 10 exchanges heat with the liquid-state cooling working medium 2 in the chassis body 1.

In the present embodiment, the working medium inlet pipe 10 is in the form of a spiral tube in the chassis body 1.

In the present embodiment, in the chassis body 1, the liquid-state cooling working medium 2 between the working medium inlet pipe 10 and the main flow channel or the secondary flow channels dissipates heat in a self-circulation manner.

In the present embodiment, the immersion liquid-cooling system further includes a circulating pump 7 and a heat exchanger 8, wherein the circulating pump 7 is installed on the working medium outlet pipe 11, and the heat exchanger 8 is connected between the working medium outlet pipe 11 and the working medium inlet pipe 10.

In the present embodiment, the secondary flow channels are adjacent to the main flow channel, and the secondary flow channels are located on both sides of the main flow channel.

In the present embodiment, the secondary fluid deflectors 9 are installed on the main fluid deflectors 3 to form the secondary flow channels.

In the present embodiment, a secondary flow channel outlet is provided at one end of each secondary flow channel that is connected to the main flow channel, and the flow adjustment plate 6 is provided on the secondary flow channel outlet; a secondary flow channel inlet is formed at one end of the secondary flow channel away from the main flow channel; and the liquid-state cooling working medium 2 can flow through the flow adjustment plates 6 through the secondary flow channels into the main flow channel.

In the present embodiment, each flow adjustment plate 6 includes shutter blades and a motor, wherein the motor is configured to control the rotation of the shutter blades.

In the present embodiment, each flow adjustment plate 6 includes an adjustable valve.

In the present embodiment, a spoilerspoiler is provided on a position of each fluid main flow guide cover 3 corresponding to the high-power component.

In the present embodiment, the spoilerspoiler is in the form of a baffle plate or wave-shaped.

In the present embodiment, in the main flow channel, a spoiler matrix structure 14 is provided to flow into one side of the high-power component, and the spoiler matrix structure 14 includes a plurality of spoiler columns arranged in an array.

In the present embodiment, the spoiler matrix structures 14 are provided on the main fluid deflectors 3.

In the present embodiment, the cross-sectional shape of each spoiler column is circular, triangular or waterdrop-shaped.

In the present embodiment, the high-power components include a chip.

An internal structure diagram of the server may be shown in FIG. 4. The server may be a computer device that includes a processor, a memory, a network interface and a database which are connected via a system bus. The processor of the computer device is configured to provide computation and control ability. The memory of the computer device includes a non-volatile storage medium and an internal memory. The non-volatile storage medium has an operating system, a computer program and a database stored therein. The internal memory provides an environment for the operating system and the computer program in the non-volatile storage medium to run. The database of the computer device is configured to store data. The network interface of the computer device is configured to connect to and communicate with an external terminal by using a network.

In the above server, differential heat exchange and cooling is achieved by performing partitioned control for components with different powers according to different requirements for heat dissipation of various components in the immersion liquid-cooling system, and the flow of fluid is coordinated and distributed according to the requirements for heat dissipation of different areas, thereby achieving directional conveying of the immersion cooling liquid and improving the comprehensive efficiency.

The specific restrictions on the server can be found in the above restrictions on the immersion liquid-cooling system, which will not be repeated here.

Embodiment 4

Based on the same inventive concept as Embodiment 1 and Embodiment 2, all the technical features of Embodiment 1 and Embodiment 2 are included in Embodiment 4. A control method for an immersion liquid-cooling system is provided in Embodiment 4 in view of the immersion liquid-cooling systems in Embodiment 1 and Embodiment 2.

Figure 5:
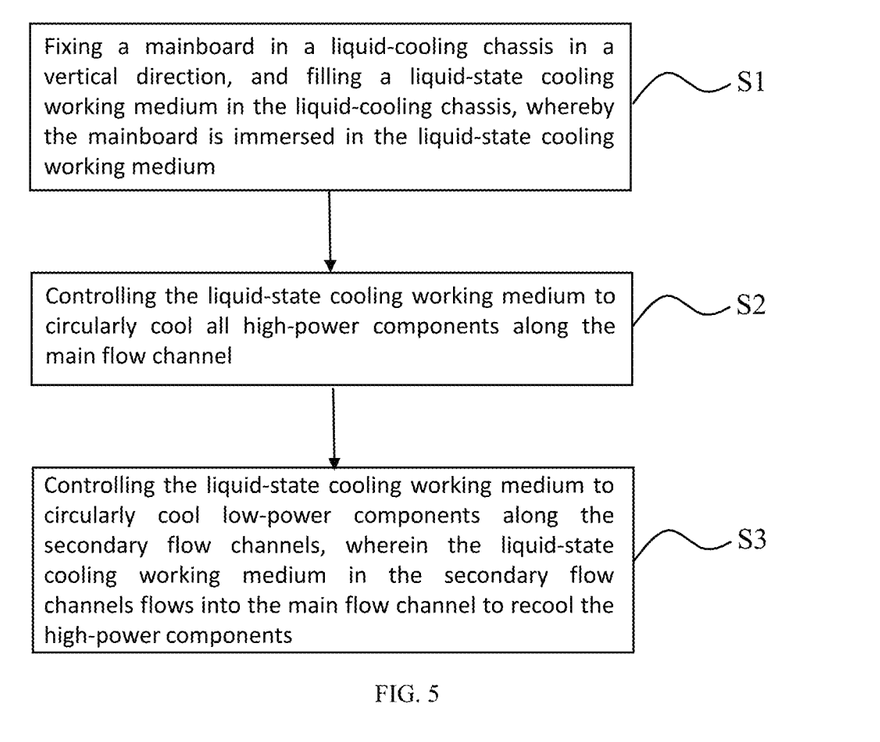
FIG. 5 is a flowchart of a control method for an immersion liquid-cooling system in one embodiment.

As shown in FIG. 5, the control method for the immersion liquid-cooling system includes the following steps:

S1, fixing a mainboard in a liquid-cooling chassis in a vertical direction, and filling a liquid-state cooling working medium 2 in the liquid-cooling chassis, whereby the mainboard is immersed in the liquid-state cooling working medium;

S2, controlling the liquid-state cooling working medium 2 to circularly cool all high-power components along the main flow channel; and S3, controlling the liquid-state cooling working medium 2 to circularly cool all low-power components along the secondary flow channels, wherein the liquid-state cooling working medium 2 in the secondary flow channels flows into the main flow channel to recool the high-power components.

As shown in FIG. 1, the high-power component areas 4 are isolated from other areas by means of the main fluid deflectors 3 to form a relatively independent flow channel. This flow channel is a main flow channel in which the immersion cooling liquid 2 flows. This flow channel is a main channel in which the immersion cooling liquid 2 flows at a high flow under the driving of the circulating pump 7, which is conducive to favorable heat dissipation of high-power components. As shown in FIG. 2, as the immersion cooling liquid 2 flows through a key device area, the main fluid deflectors 3 are bent towards the device area, whereby a flow channel in the key device area become narrowed and the flow in a heat exchange area of a key device is further increased, which is conducive to heat dissipation.

Further, a baffle-plate-shaped spoilerspoiler 12 and a wave-shaped spoilerspoiler 13 can be designed at the top of the key device area of each main flow guide cover, or a plurality of spoiler columns arranged in an array are adopted to form a spoiler matrix structure 14 which is provided at the front of a chip, and adjacent two rows of spoiler columns are staggered at the front of the chip to enhance the disturbance in the key device area and enhance the heat transfer of the chip.

For the low-power component areas 5, in the present application, effective flow guide is performed by means of the secondary fluid deflectors 9; the secondary fluid deflectors 9 are installed on the main fluid deflectors 3 to form secondary flow channels; the secondary flow channels are connected to the main flow channel through the flow adjustment plates 6 (preferably, a shutter with an adjustable opening degree); the shutter drives blades to rotate through a motor to adjust the opening degree of the shutter, thereby effectively adjusting the flow of the fluid flowing into the main flow channel from the secondary flow channels, then effectively controlling the flow of the working medium in the secondary flow channels, and accordingly adjusting the temperature of the low-power component areas 5 in the secondary flow channels.

The working medium outlet pipe 11 of the whole system is installed in the main flow channel area. Under the action of the circulating pump 7, the fluid in the main flow channel is pumped out of the chassis, and the high-temperature fluid heated by the components is conveyed into the heat exchanger 8 by means of the circulating pump 7, and is cooled by an external cold source in the heat exchanger 8 to obtain a low-temperature working medium, and then the low-temperature working medium is conveyed back to the chassis through the working medium inlet pipe 10.

The low-temperature working medium from the heat exchanger 8 enters the chassis, penetrates deep into the bottom portion of the chassis through a pipeline, and then turns back to the top portion of the chassis and into the system. The pipeline in the chassis may be set in the shape of a spiral tube, which increases a heat exchange area between the pipeline and immersed liquid, and facilitates to cooling the immersed liquid that does not participate in the circulation in the chassis. After this method is adopted, the low-temperature working medium is provided on one side of the chassis, and a high-temperature working medium is provided at components other than the main flow channel and the secondary flow channels. There is a density difference between the high-temperature working medium and the low-temperature working medium, so the self-circulation of the low-temperature working medium and the high-temperature working medium is formed under the driving of the density difference, which is conducive to realizing the self-circulation heat dissipation of the low-power components.

The system has good operating economy, and can adjust the flow of the system and the opening degree of the shutter according to a difference between a junction temperature Tj of each chip and a maximum temperature Tspec required by heat dissipation of each party (Spec) during the system debugging process. As the power of the chip in the main flow channel increases, resulting in Tj being higher than Tspec, under the premise that Tj of the chip in the other secondary flow channel is lower than Tspec, the opening degree of the shutter is reduced, the heat dissipation efficiency of the chip in the main flow channel is improved, and Tj is reduced. If the heat dissipation of the chip in the secondary flow channels reaches the limit such that the heat dissipation of the chip in the main flow channel cannot be strengthened by the adjustment of the shutter, and if Tj in the main flow channel is still higher than Tspec at this time, the power of the circulating pump 7 can be increased, and the circulation rate of the immersed liquid can be increased, thereby reducing the junction temperature of the chip.

During the normal operation process, Tjs of all devices are lower than Tspec, an area with a large difference between Tj and Tspec can be identified at this time, and the opening degree of the shutter in this area can be adjusted to reduce the difference between the two values, so as to minimize the circulation rate of the cooling working medium, reduce the power consumption of the pump, and improve the economy of the system.

Specifically, the control method for the immersion liquid-cooling system further includes:
  acquiring an operating temperature (junction temperature Tj) of the high-power components and a maximum operating temperature (Tspec) of all low-power components;
  when the operating temperature of the high-power components in the main flow channel is higher than the maximum operating temperature of the low-power components in all secondary flow channels, reducing a flow of the liquid-state cooling working medium flowing into the main flow channel from the secondary flow channels; when the flow of the liquid-state cooling working medium flowing into the main flow channel from the secondary flow channels cannot be reduced, increasing a circulation rate of the liquid-state cooling working medium in the main flow channel; and
  when the operating temperature of the high-power components in the main flow channel is lower than the maximum operating temperature of the low-power components in all secondary flow channels, identifying areas where a difference between the operating temperature of the high-power components in the main flow channel and the maximum operating temperature of the low-power components in the secondary flow channels is greater than a first threshold, increasing the flow of the liquid-state cooling working medium flowing into the main flow channel from the secondary flow channels, and/or decreasing the circulation rate of the liquid-state cooling working medium in the main flow channel.

The single-phase immersion liquid-cooling system that can achieve partitioned temperature control provided by the present embodiment can solve the problem of different requirements for heat dissipation of various components in the immersion liquid-cooling system and achieve the function of coordinating and distributing the flow of fluid according to the requirements for heat dissipation of different areas, whereby the immersion liquid-cooling system can realize efficient and economical circulation of the cooling working medium.

The single-phase immersion liquid-cooling system that can achieve partitioned temperature control provided by the present embodiment can achieve the adjustment of flow in different areas by providing the flow guide covers to distinguish the main flow channel from the secondary flow channels in combination the shutter, and also achieve the purpose of partitioned temperature control, thereby minimizing the circulation rate of the cooling working medium and reducing the power consumption of the pump.

As shown in FIG. 3, a baffle-plate-shaped spoilerspoiler 12 and a wave-shaped spoilerspoiler 13 can be designed at the top of the key device area of the main flow guide cover, or a plurality of spoiler columns arranged in an array are adopted to form a spoiler matrix structure 14 which is provided at the front of the chip, and adjacent two rows of spoiler columns are staggered at the front of the chip to enhance the disturbance in the key device area and enhance the heat transfer of the chip.

It is understandable that the main flow channel and the secondary flow channels in the present embodiment can be specifically adjusted and designed according to actual situations, and a path of the working medium inlet pipe into the system is also only schematic, and can be adjusted accordingly according to the structure; and the shutter may also be replaced with other forms of adjustable valves, etc. The arrangement of the wave-shaped plate, the baffle plate or the spoiler columns mentioned in the present embodiment may also be replaced with other spoiler modes, and the cross-sectional shape of the spoiler column may be circular, triangular or waterdrop-shaped, etc.

The specific restrictions on the control method for the immersion liquid-cooling system can be found in the above restrictions on the immersion liquid-cooling system as described above, which will not be repeated here.

Technical features of the foregoing embodiments may be randomly combined. To make description concise, not all possible combinations of the technical features in the foregoing embodiments are described. However, the combinations of these technical features shall be considered as falling within the scope recorded by this specification provided that no conflict exists.

The foregoing embodiments only describe several implementations of this application, which are described specifically and in detail, but cannot be construed as a limitation to the patent scope of this application. It should be noted that for a person of ordinary skill in the art, several transformations and improvements can be made without departing from the idea of this application. These transformations and improvements belong to the protection scope of this application. Therefore, the protection scope of the patent of this application shall be subject to the appended claims.

What is claimed is:

1. An immersion liquid-cooling system, comprising a liquid-cooling chassis and a mainboard;
  wherein the mainboard is fixed in the liquid-cooling chassis in a vertical direction, and the liquid-cooling chassis is filled with a liquid-state cooling working medium, whereby the mainboard is immersed in the liquid-state cooling working medium;
  the mainboard is provided with at least one high-power component and at least one low-power component; the heat dissipation capacity of the high-power components per unit time is greater than the heat dissipation capacity of the low-power components per unit time;

the liquid-cooling chassis comprises a chassis body, main fluid deflectors, secondary fluid deflectors, and flow adjustment plates; the main fluid deflectors extend in the vertical direction to form a main flow channel, and the main flow channel contains all of the high-power components; the secondary fluid deflectors are arranged opposite to the main fluid deflectors to form secondary flow channels, and the secondary flow channels contain the low-power components; and the secondary flow channels are connected to the main flow channel by means of the flow adjustment plates;

wherein the secondary flow channels are adjacent to the main flow channel, and the secondary flow channels are located on both sides of the main flow channel;

wherein one end of each of the secondary flow channels connected to the main flow channel is a secondary flow channel outlet, and the flow adjustment plate is provided on the secondary flow channel outlet;

the other end of the secondary flow channel away from the main flow channel forms a secondary flow channel inlet; and the liquid-state cooling working medium can flow through the flow adjustment plates via the secondary flow channels into the main flow channel.

2. The immersion liquid-cooling system according to claim 1, wherein the chassis body is provided with a working medium inlet at a top portion thereof and a working medium outlet at a bottom portion thereof; and the main flow channel is provided with a main flow channel inlet at a top end thereof and a main flow channel outlet at a bottom end thereof, wherein the main flow channel inlet is arranged adjacent to the working medium inlet, and the main flow channel outlet is communicated with the working medium outlet.

3. The immersion liquid-cooling system according to claim 2, wherein the immersion liquid-cooling system further comprises a working medium inlet pipe and a working medium outlet pipe; and the working medium inlet pipe is connected to the working medium inlet, and the working medium outlet pipe is connected to the working medium outlet.

4. The immersion liquid-cooling system according to claim 3, wherein the working medium inlet pipe extends from the top portion of the chassis body to the bottom portion of the chassis body in the chassis body, and then extends from the bottom portion of the chassis body to above the main flow channel inlet; and the liquid-state cooling working medium in the working medium inlet pipe exchanges heat with the liquid-state cooling working medium in the chassis body.

5. The immersion liquid-cooling system according to claim 3, wherein the working medium inlet pipe is in the form of a spiral tube in the chassis body.

6. The immersion liquid-cooling system according to claim 3, wherein in the chassis body, the liquid-state cooling working medium between the working medium inlet pipe and the main flow channel or the secondary flow channels dissipates heat in a self-circulation manner.

7. The immersion liquid-cooling system according to claim 3, further comprising a circulating pump and a heat exchanger, wherein the circulating pump is installed on the working medium outlet pipe, and the heat exchanger is connected between the working medium outlet pipe and the working medium inlet pipe.

8. The immersion liquid-cooling system according to claim 7, wherein the circulating pump is configured to:

increase a circulation rate of the liquid-state cooling working medium in the main flow channel when an operating temperature of the high-power components in the main flow channel is higher than a maximum operating temperature of the low-power components in all secondary flow channels; and decrease the circulation rate of the liquid-state cooling working medium in the main flow channel when the operating temperature of the high-power components in the main flow channel is lower than the maximum operating temperature of the low-power components in all secondary flow channels.

9. The immersion liquid-cooling system according to claim 1, wherein a depth of the liquid-state cooling working medium in the chassis body is greater than a length of the mainboard along the vertical direction, so that the mainboard, the main flow channel and the secondary flow channels are completely immersed in the liquid-state cooling working medium.

10. The immersion liquid-cooling system according to claim 1, wherein the secondary fluid deflectors are installed on the main fluid deflectors to form the secondary flow channels.

11. The immersion liquid-cooling system according to claim 1, wherein each of the flow adjustment plates comprises shutter blades and a motor, wherein the motor is configured to control the rotation of the shutter blades.

12. The immersion liquid-cooling system according to claim 1, wherein each of the flow adjustment plates comprises an adjustable valve.

13. The immersion liquid-cooling system according to claim 1, wherein each of the main fluid deflectors is provided with spoilers at a position corresponding to the high-power component.

14. The immersion liquid-cooling system according to claim 13, wherein the spoiler is in the form of a baffle plate or wave-shaped.

15. The immersion liquid-cooling system according to claim 1, wherein in the main flow channel, a spoiler matrix structure is provided upstream of the high-power component, and the spoiler matrix structure comprises a plurality of spoiler columns arranged in an array.

16. The immersion liquid-cooling system according to claim 15, wherein the spoiler matrix structures are provided on the main fluid deflectors.

17. The immersion liquid-cooling system according to claim 15, wherein a cross-sectional shape of each of spoiler columns is circular, triangular or waterdrop-shaped.

18. The immersion liquid-cooling system according to claim 1, wherein the high-power components comprise a chip.

19. The immersion liquid-cooling system according to claim 1, wherein the flow adjustment plates are configured to:

reduce a flow of the liquid-state cooling working medium flowing into the main flow channel from the secondary flow channels when an operating temperature of the high-power components in the main flow channel is higher than a maximum operating temperature of the low-power components in all secondary flow channels; and increase the flow of the liquid-state cooling working medium flowing into the main flow channel from the secondary flow channels when the operating temperature of the high-power components in the main flow channel is lower than the maximum operating temperature of the low-power components in all secondary flow channels.

20. A server, comprising an immersion liquid-cooling system comprising a liquid-cooling chassis and a mainboard;
- wherein the mainboard is fixed in the liquid-cooling chassis in a vertical direction, and the liquid-cooling chassis is filled with a liquid-state cooling working medium, whereby the mainboard is immersed in the liquid-state cooling working medium;
- the mainboard is provided with at least one high-power component and at least one low-power component; the heat dissipation capacity of the high-power components per unit time is greater than the heat dissipation capacity of the low-power components per unit time;
- the liquid-cooling chassis comprises a chassis body, main fluid deflectors, secondary fluid deflectors, and flow adjustment plates; the main fluid deflectors extend in the vertical direction to form a main flow channel, and the main flow channel contains all of the high-power components; the secondary fluid deflectors are arranged opposite to the main fluid deflectors to form secondary flow channels, and the secondary flow channels contain the low-power components; and the secondary flow channels are connected to the main flow channel by means of the flow adjustment plates;
- wherein the secondary flow channels are adjacent to the main flow channel, and the secondary flow channels are located on both sides of the main flow channel;
- wherein one end of each of the secondary flow channels connected to the main flow channel is a secondary flow channel outlet, and the flow adjustment plate is provided on the secondary flow channel outlet;
- the other end of the secondary flow channel away from the main flow channel forms a secondary flow channel inlet; and
- the liquid-state cooling working medium can flow through the flow adjustment plates via the secondary flow channels into the main flow channel.

* * * * *